United States Patent [19]

Shigemori et al.

[11] 4,065,733
[45] Dec. 27, 1977

[54] TRANSISTOR BLOCKING OSCILLATOR STABILIZED AGAINST CHANGES IN BIAS VOLTAGE AND TEMPERATURE

[75] Inventors: Youjiro Shigemori; Yoshio Mitumori, both of Shizuoka, Japan

[73] Assignee: Star Seimitsu Kabushika Kaisha, Japan

[21] Appl. No.: 769,685

[22] Filed: Feb. 17, 1977

[51] Int. Cl.$^2$ .............................................. H03K 3/30
[52] U.S. Cl. ............................... 331/112; 331/116 M; 331/186; 340/384 R
[58] Field of Search ................... 331/112, 116 M, 186, 331/109, 176; 340/384 R, 384 E

[56] References Cited

U.S. PATENT DOCUMENTS

| | | | |
|---|---|---|---|
| 3,887,914 | 6/1975 | Sato et al. | 340/384 R |
| 3,945,004 | 3/1976 | Myers | 340/384 R X |
| 3,986,183 | 10/1976 | Fujiwara | 340/384 R X |

*Primary Examiner*—Siegfried H. Grimm
*Attorney, Agent, or Firm*—Holman & Stern

[57] ABSTRACT

A blocking oscillator for driving the armature of a buzzer comprises a transistor which is stabilized against changes in ambient temperature and fluctuations of a supply voltage. A core is provided for magnetically driving the armature, and carries thereon a drive coil which induces a regularly varying electromagnetic field therein as well as a control coil which is connected in feedback relationship with the drive coil. The drive coil forms together with the collector emitter path of the transistor a series circuit, which is connected with a power supply and which is shunted by another series circuit comprising a resistor, the control coil and a diode and which is also connected across the power supply. The base of the transistor is connected with the junction between the resistor and the control coil. The control coil is shunted by a forwardly poled diode. The diodes and the transistor are formed of a semiconductor material of the same kind so that their responses to changes in ambient temperature are similar to each other. In this manner, the diodes supply a bias voltage which varies with a change in the threshold voltage of the transistor as ambient temperature changes. The series combination of the diodes applies a bias voltage of substantially constant magnitude across the base and emitter of the transistor upon fluctuation of the supply voltage.

2 Claims, 7 Drawing Figures

TRANSISTOR BLOCKING OSCILLATOR STABILIZED AGAINST CHANGES IN BIAS VOLTAGE AND TEMPERATURE

FIELD AND BACKGROUND OF THE INVENTION

The invention relates to a blocking oscillator for use in a buzzer, and more particularly, to a transistor oscillator circuit which is stabilized against changes in ambient temperature and fluctuations of a supply voltage.

A blocking oscillator for use in a buzzer and comprising npn or pnp transistor is well known, and is described in German Laid-open Application No. 2,110,918 and U.S. Pat. No. 3,564,542, for example. One form of known blocking oscillator comprising an npn transistor is illustrated in FIG. 1 where terminals 1 and 2 are adapted to be connected with a power supply. A current flow through resistor and control coil $L_2$ establishes a bias voltage across the base and emitter of a transistor T, which therefore conducts to permit a current flow through its collector-emitter path including a drive coil $L_1$. The both coils $L_1$ and $L_2$ are disposed on a common core to provide an inductive coupling between them. The current flow through the drive coil $L_1$ induces a voltage across the control coil $L_2$ which is of a polarity to reduce the base-emitter voltage $V_{BE}$ of the transistor T below the bias voltage, thus rendering the transistor cut-off. Thereupon a reverse e.m.f. is induced across the control coil $L_2$ to maintain the transistor cut-off. As the reverse e.m.f. is discharged through a loop including the emitter and base of the transistor and the voltage $V_{BE}$ across the base and emitter path of the transistor increases, it is again rendered conductive. The process is periodically repeated at a rapid rate, which determines the frequency with which an armature is magnetically driven by the core.

One of the requirements for a proper operation of the blocking oscillator is that the transistor T must be rendered conductive when the power is initially turned on. Another requirement relates to the voltage induced across the control coil $L_2$ which must be sufficient to reduce the voltage across the base and emitter of the transistor below the bias voltage so that the latter is made cut-off. This requires that the transistor maintains a proper value of the bias voltage. However, when the oscillator is used in an environment having a varying ambient temperature, a variation in the operational characteristic of the transistor prevents a proper operation from being achieved if the bias voltage across the base and emitter is maintained constant.

Reference is made to FIG. 4 which graphically shows the collector current $I_C$ plotted against the base-emitter voltage $V_{BE}$ of the transistor at ambient temperatures of $+80°$ C, $+25°$ C and $-25°$ C. Assuming that a proper oscillator operation is achieved at an ambient temperature of $+25°$ C when the operating point of the transistor T is chosen at $a$ on the graph, a change of the ambient temperature to 80° C will shift the operating point of the transistor to $b$. Once it conducts, the transistor cannot be turned off and remains on since the induced voltage across the control coil is insufficient to reduce the voltage $V_{BE}$ below the threshold voltage of the transistor. On the other hand, when the ambient temperature changes to $-25°$ C, the voltage $V_{BE}$ is less than the threshold voltage, failing to turn on the transistor.

U.S. Pat. No. 3,887,914 issued to the common assignee as the present assignee proposed a circuit arrangement as shown in FIG. 2 of this application in which a diode D is connected in series with the control coil $L_2$ in order to compensate for the effect of a change in the ambient temperature on the base-emitter voltage $V_{BE}$. In this instance, the diode comprises the same type of semiconductor material as the transistor, and thus is formed of silicon where the transistor is formed of silicon, and is preferably placed under the same thermal condition as the transistor. This achieves a forward voltage $(V_F)$ versus forward current $(I_F)$ characteristic of the diode which is approximately similar in configuration to the $V_{BE}$ - $I_C$ characteristic of the transistor. A variation in the characteristic due to temperature changes will also become similar in the both devices (see FIGS. 4 and 5). In this manner, the bias voltage can be varied so as to compensate for a change in the threshold voltage of the transistor.

With continued reference to FIG. 4, we will consider a change of the ambient temperature from $+25°$ C to $+80°$ C. The operation of the transistor will then shift to the leftmost characteristic curve, and if the transistor was properly operating at point $a$ under the ambient temperature of $+25°$ C, the shift of the diodes' characteristic (see FIG. 5) as a result of the temperature change will reduce the bias voltage, bringing the operating point of the transistor to point $a'$. It will thus be seen that the transistor now operates in the same way as it operated under the ambient temperature of $+25°$ C. Thus it is possible to maintain an oscillation of the transistor for all temperature changes, whereby it is assured that the drive coil $L_1$ will induce a periodically varying electromagnetic field in the core 3.

However, the improved blocking oscillator suffers from the dependency on the supply voltage in that while the $V_{BE}$-$I_C$ characteristic of the transistor remains unchanged (assuming no temperature change), the bias voltage of the transistor will vary with a fluctuation of the supply voltage. FIG. 3 illustrates a conventional way of suppressing a fluctuation of the supply voltage by connecting a Zener diode ZD across the oscillator circuit and connecting the parallel combination across the power supply in series with a resistor $R_2$. However, the connection of the resistor $R_2$ requires an increased supply voltage and also represents a power loss.

SUMMARY OF THE INVENTION

It is an object of the invention to provide a blocking oscillator which is stabilized against changes in the ambient temperature which cause a change in the transistor response by providing a compensated bias voltage and which is also stabilized against a fluctuation of a supply voltage by providing a constant bias voltage across the base and emitter of the transistor.

It is another object of the invention to provide a blocking oscillator which operates on a low voltage while minimizing a power loss.

In accordance with the invention, there is provided a blocking oscillator comprising a pair of terminals for connection with a d.c. supply, a transistor having a base, emitter and collector, a resistor connected to supply a base bias to the transistor, a core of high magnetic permeability, a drive coil and a control coil disposed on the core so as to be inductively coupled with each other, the drive coil and the collector-emitter path of the transistor forming a series circuit which is connected across the pair of terminals, another series circuit including the resistor and the control coil being connected across the pair of terminals, the base of the transistor being connected with the junction between the resistor and the control coil, a first forwardly poled diode connected in series between the control circuit and one of the terminals, and a second, forwardly poled diode connected in shunt with the control coil, the transistor and the first and the second diodes being formed of a semiconductor material of a same kind.

When it is desired to increase the current flow through the drive coil, a plurality of transistors may be connected in Darlington configuration, with the transistor in the initial stage having its base connected with the junction between the bias resistor and the control coil and with the collector-emitter path of the transistor in the final stage being connected in series with the drive coil. A number of diodes which are equal to the number of transistors used are connected between the control coil and said one terminal.

Since the blocking oscillator of the invention is stabilized against changes in the ambient temperature and fluctuation of the supply voltage, it may be advantageously utilized in watches and clocks of various types as well as buzzers on automobiles and aircraft where severe environmental conditions apply.

DESCRIPTION OF PREFERRED EMBODIMENTS

Figure 1:
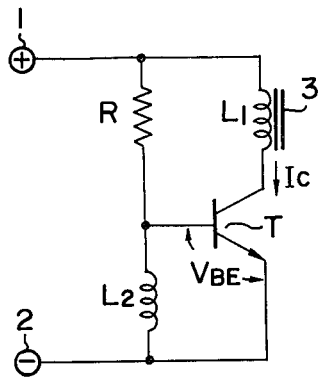
FIG. 1 is a circuit diagram of a standard blocking oscillator.
Figure 2:
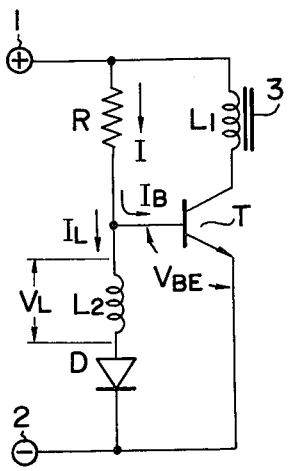
FIG. 2 is a circuit diagram of a known blocking oscillator including a temperature compensation diode.
Figure 3:
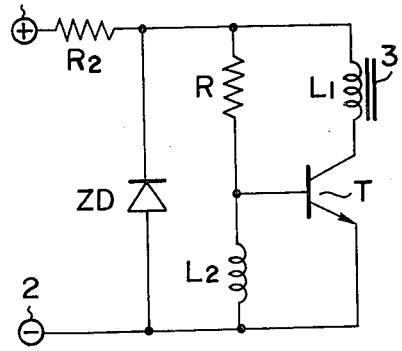
FIG. 3 is a circuit diagram of a known blocking oscillator including a voltage compensation Zener diode.
Figure 4:
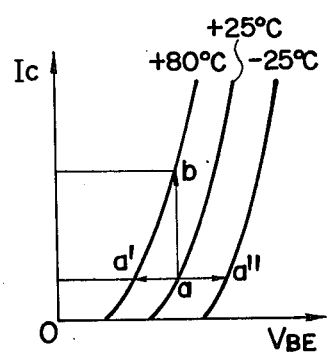
FIG. 4 graphically shows the collector current as plotted against the base-emitter voltage of a transistor at several ambient temperatures.
Figure 5:
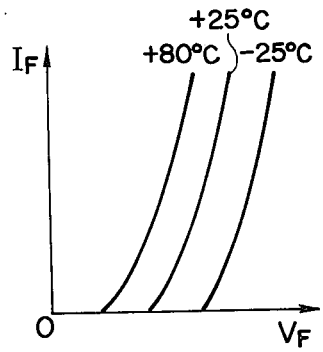
FIG. 5 graphically shows the forward current versus forward voltage characteristics of a diode at several ambient temperatures.
Figure 6:
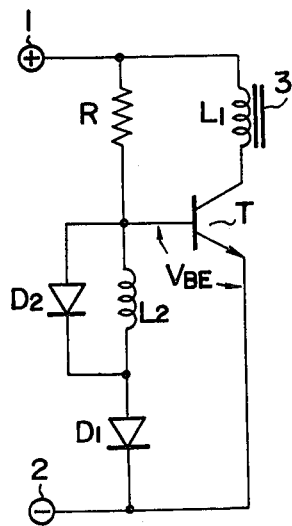
FIG. 6 is a circuit diagram of the blocking oscillator according to the invention.

Referring to FIG. 6, the blocking oscillator of the invention also includes a pair of terminals 1, 2 for connection with a power supply. A drive coil $L_1$ is connected in series with the collector-emitter path of a transistor T across the terminals 1, 2. The transistor is shown as npn type, and hence the terminal 1 is connected with a positive terminal and the terminal 2 with a negative terminal of the power supply. A series circuit including a resistor R, which supplies a base bias to the transistor T, and a control coil $L_2$ is also connected across the terminals. In accordance with the invention, this series circuit also includes a diode $D_1$ which is connected between the control coil $L_2$ and the terminal 2 and is forwardly poled. The junction between the resistor R and the control coil $L_2$ is connected with the base of the transistor. The drive coil $L_1$ and the control coil $L_2$ are disposed on a common core 3 as a bifilar winding and have a close inductive coupling therebetween. Also, in accordance with the invention, another diode $D_2$ is connected in shunt with the control coil L and is forwardly poled.

The transistor T and the diodes $D_1$ and $D_2$ are formed of the same kind of semiconductor material. For example, if a silicon transistor is used, the diodes are formed of silicon. During the wiring of the circuit connection, they are preferably disposed so as to be placed under the same thermal condition. As a consequence of these considerations, it is assured that the $I_C$-$V_{BE}$ characteristic of the transistor and the $I_F$-$V_F$ characteristic of the diodes $D_1$, $D_2$ are similar in configuration as is the amount of changes which occur in these characteristics as the ambient temperature changes. Thus it is possible to provide a bias voltage which compensates for a variation in the threshold voltage of the transistor. In the arrangement of the invention, when the $I_C$-$V_{BE}$ characteristic of the transistor remains unchanged but the supply voltage fluctuates, it will be understood that since the voltage across the control coil $L_2$ is maintained substantially constant by the diode $D_2$, a bias voltage across the base and emitter of the transistor can also be maintained substantially constant by a series circuit formed by the diodes $D_1$ and $D_2$. Thus a normal oscillating condition of the transistor T can be maintained for all fluctuations of the supply voltage.

Figure 7:
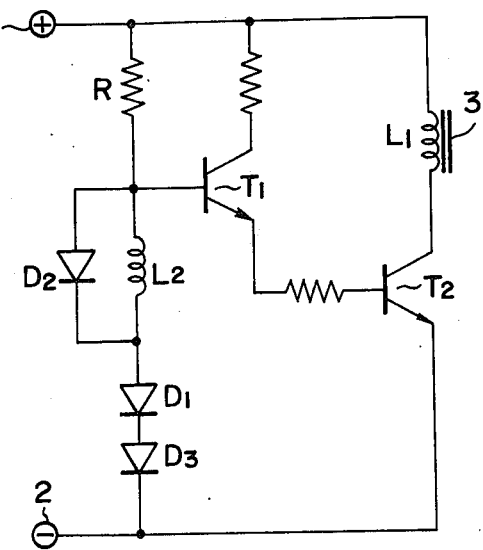
FIG. 7 is a circuit diagram of another embodiment of the invention.

FIG. 7 shows another embodiment of the invention in which the blocking oscillator comprises a pair of transistors $T_1$ and $T_2$ connected in Darlington configuration. In this case, the drive coil $L_1$ is connected between the terminal 1 and the collector of transistor $T_2$ in the final stage. As before, diode $D_2$ is connected in shunt with the control coil $L_2$. A pair of diodes $D_1$ and $D_3$ are connected in series with the parallel combination of the diode $D_2$ and the control coil $L_2$ so as to correspond to the use of the pair of transistors $T_1$ and $T_2$. The operation remains unchanged.

While the invention has been described above in connection with several preferred embodiments thereof, it should be understood that the invention is not limited thereto, but that a number of changes and modifications will occur to those skilled in the art. For example, instead of npn transistor, a pnp transistor may be used as well, with the polarity of the supply and of the diodes $D_1$ to $D_3$ reversed. The electronic circuit may be formed as a monolithic integrated circuit. Therefore, it is intended that the scope of the invention be solely defined by the appended claims.

What is claimed is:

1. A blocking oscillator comprising a pair of terminals for connection with a d.c. supply, a transistor having a base, emitter and collector, a resistor connected to supply a base bias to the transistor, a core of high magnetic permeability, a drive coil and a control coil disposed on the core so as to be inductively coupled with each other, the drive coil and the collector-emitter path of the transistor forming a series circuit which is connected across the pair of terminals, another series circuit including the resistor and the control coil being connected across the pair of terminals, the base of the transistor being connected with the junction between the resistor and the control coil, a first, forwardly poled diode connected in series between the control circuit and one of the terminals, and a second, forwardly poled diode connected in shunt with the control coil, the transistor and the first and the second diodes being formed of a semiconductor material of a same kind.

2. A blocking oscillator comprising a pair of terminals for connection with a d.c. supply, a Darlington circuit including a plurality of transistors each having a base, emitter and collector, a resistor connected to supply a base bias to a transistor in the first stage of the circuit, a core of high magnetic permeability, a drive coil and a control coil disposed on the core so as to be inductively coupled with each other, the drive coil and the collector-emitter path of a transistor in the final stage of the circuit forming a series circuit which is connected across the pair of terminals, another series circuit including the resistor and the control coil being connected across the pair of terminals, the base of the transistor in the first stage being connected with the junction between the resistor and the control coil, a plurality of diodes connected in series between the control coil and one of the terminals and forwardly poled, and an additional diode connected in shunt with the control coil and forwardly poled, the transistors and the diodes being all formed of a semiconductor material of a same kind.

* * * * *